United States Patent
Kobayashi et al.

(10) Patent No.: US 10,306,813 B2
(45) Date of Patent: May 28, 2019

(54) APPARATUS WITH MOTOR DRIVE DEVICE, TO WHICH MOTOR DRIVE DEVICE CAN BE EASILY ATTACHED

(71) Applicant: FANUC CORPORATION, Yamanashi (JP)

(72) Inventors: Minoru Kobayashi, Yamanashi (JP); Tsutomu Shikagawa, Yamanashi (JP); Kiichi Inaba, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 196 days.

(21) Appl. No.: 15/241,243

(22) Filed: Aug. 19, 2016

(65) Prior Publication Data

US 2017/0063205 A1    Mar. 2, 2017

(30) Foreign Application Priority Data

Aug. 25, 2015    (JP) .................................. 2015-165745

(51) Int. Cl.
*H05K 7/20*    (2006.01)

(52) U.S. Cl.
CPC ......... *H05K 7/209* (2013.01); *H05K 7/20163* (2013.01); *H05K 7/20418* (2013.01)

(58) Field of Classification Search
CPC ...................................................... H05K 7/20
USPC ....................................... 73/493; 361/679.58
See application file for complete search history.

(56) References Cited

U.S. PATENT DOCUMENTS

| | | | | |
|---|---|---|---|---|
| 9,696,769 | B1 * | 7/2017 | Hamilton | ................ G06F 1/181 |
| 2012/0293946 | A1 * | 11/2012 | Zheng | ................ G06F 1/181 |
| | | | | 361/679.33 |
| 2012/0300397 | A1 * | 11/2012 | Yang | ................ G06F 1/184 |
| | | | | 361/679.58 |
| 2013/0235528 | A1 * | 9/2013 | Lee | ................ H05K 7/20418 |
| | | | | 361/704 |
| 2015/0282384 | A1 * | 10/2015 | Ho | ................ H05K 7/20172 |
| | | | | 361/695 |
| 2016/0128208 | A1 * | 5/2016 | Bolik | ................ H05K 5/0069 |
| | | | | 361/709 |

(Continued)

FOREIGN PATENT DOCUMENTS

| | | |
|---|---|---|
| DE | 1997367 U | 11/1968 |
| DE | 3335819 A1 | 4/1985 |

(Continued)

OTHER PUBLICATIONS

English Abstract and Machine Translation for Japanese Publication No. 2015-103750 A, published Jun. 4, 2015, 7 pgs.

(Continued)

*Primary Examiner* — Forrest M Phillips
(74) *Attorney, Agent, or Firm* — Fredrikson & Byron, P.A.

(57) ABSTRACT

An apparatus with a motor drive device is provided with a support plate including an opening part for supporting the motor drive device. The support plate includes a first edge part around the opening part and a second edge part on the opposite side of the first edge part. The motor drive device includes a first recessed part formed on one end part in a predetermined direction, and a second recessed part formed on the other end part on the opposite side of the one end part. The first edge part is inserted into the first recessed part, and the second edge part is inserted to the second recessed part.

5 Claims, 10 Drawing Sheets

(56) References Cited

U.S. PATENT DOCUMENTS

| | | | | |
|---|---|---|---|---|
| 2016/0353598 A1* | 12/2016 | Chen | ................. | H05K 7/1487 |
| 2017/0231112 A1* | 8/2017 | Dunn | ................. | H05K 7/20145 |
| 2017/0347479 A1* | 11/2017 | Ando | ................. | H05K 7/1417 |

FOREIGN PATENT DOCUMENTS

| | | | |
|---|---|---|---|
| DE | 4317119 | C2 | 4/1996 |
| DE | 19855389 | C2 | 10/2002 |
| DE | 102009024272 | A1 | 12/2010 |
| JP | 56118400 | A | 9/1981 |
| JP | 7159012 | A | 6/1995 |
| JP | 8207955 | A | 8/1996 |
| JP | 11220277 | A * | 8/1999 |
| JP | 2015103750 | A | 6/2015 |

OTHER PUBLICATIONS

English Abstract for Japanese Publication No. JPH11220277 A, published Aug. 10, 1999, 1 pg.

English Abstract for Japanese Publication No. JPH08207955 A, published Aug. 13, 1996, 1 pg.

English Abstract for Japanese Publication No. JPH07159012 A, published Jun. 20, 1995, 1 pg.

English Machine Translation for Japanese Publication No. JPS56118400 A, published Sep. 17, 1981, 4 pgs.

Untranslated Decision to Grant a Patent mailed by Japan Patent Office (JPO) for Application No. JP 2015-165745 dated Nov. 14, 2017, 3 pages.

English machine translation of Decision to Grant a Patent mailed by Japan Patent Office (JPO) for Application No. JP 2015-165745 dated Nov. 14, 2017, 3 pages.

Untranslated Notification of Reasons for Refusal mailed by Japan Patent Office (JPO) for Application No. JP 2015-165745 dated Sep. 5, 2017, 3 pages.

Translated Notification of Reasons for Refusal mailed by Japan Patent Office (JPO) for Application No. JP 2015-165745 dated Sep. 5, 2017, 3 pages.

English Abstract and Machine Translation for German Publication No. 19855389 C2, published Oct. 31, 2002, 7 pgs.

English Abstract and Machine Translation for German Publication No. 4317119 C2, published Apr. 4, 1996, 7 pgs.

English Abstract and Machine Translation for German Publication No. 1997367 U, published Nov. 28, 1968, 4 pgs.

English Abstract and Machine Translation for German Publication No. 3335819 Al, published Mar. 11, 1985, 4 pgs.

English Abstract and Machine Translation for German Publication No. 102009024272 Al, published Dec. 16, 2010, 8 pgs.

* cited by examiner

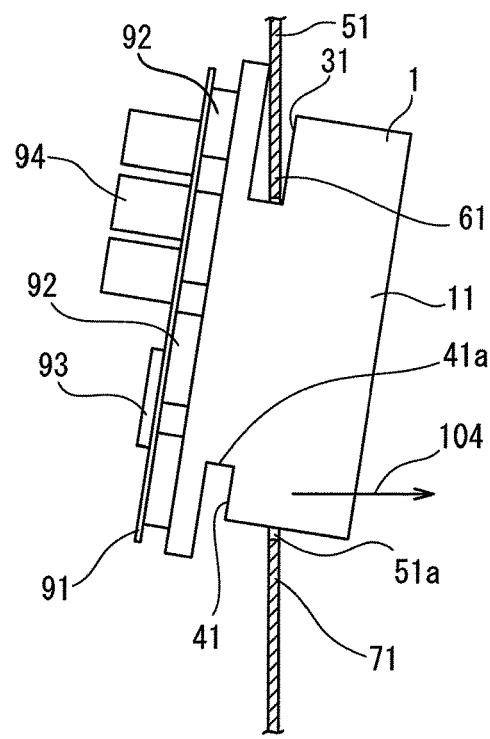
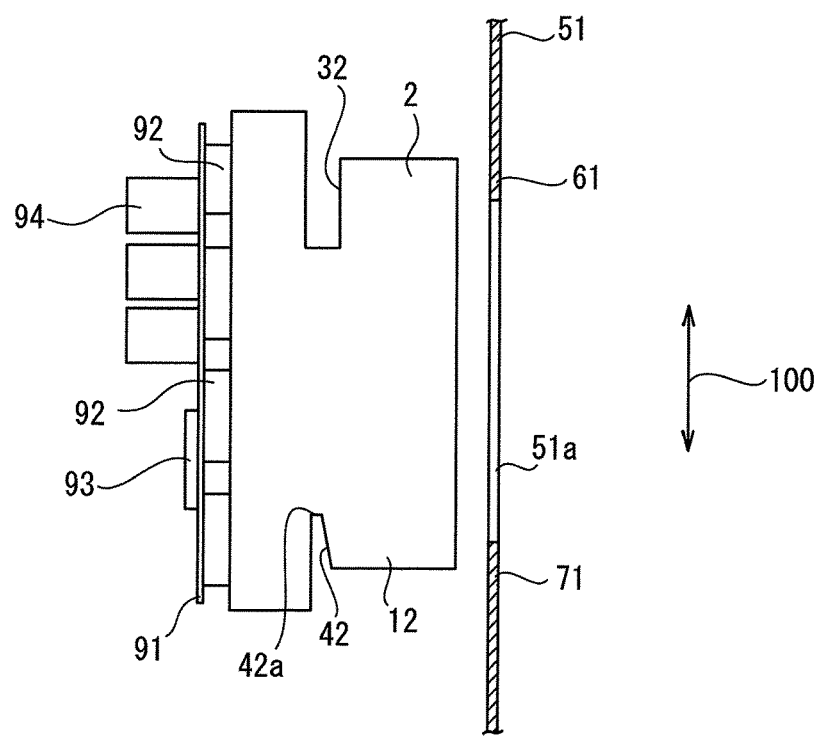

APPARATUS WITH MOTOR DRIVE DEVICE, TO WHICH MOTOR DRIVE DEVICE CAN BE EASILY ATTACHED

BACKGROUND OF THE INVENTION

1. Field of the Invention

The present invention relates to an apparatus provided with a motor drive device.

2. Description of the Related Art

A motor drive device for driving a motor is disposed in an apparatus provided with a motor for driving a predetermined portion of a robot, a machine tool, etc. The motor drive device is provided with a semiconductor element, a capacitor, etc. for controlling electric current supplied to the motor. The motor drive device is disposed in a power magnetics cabinet in which, for example, an electromagnetic switch, a relay, or a battery is disposed. Further, the motor drive device is secured to a predetermined position in the power magnetics cabinet.

Japanese Unexamined Patent Publication No. 2015-103750A discloses a motor drive device provided with a power device mounted on a printed board. This publication discloses that the motor drive device is attached to a wall surface of a power magnetics cabinet.

The motor drive device is secured to various portions. When being disposed in, for example, the power magnetics cabinet, the motor drive device is secured to a wall surface or a shelf plate of a shelf in the power magnetics cabinet. In conventional technologies, the motor drive device is secured to a wall surface or a shelf plate by screws.

However, when the motor drive device is large or heavy, the number of screws for securing increases, and lots of time and effort are taken to perform an attaching operation. Further, the number of parts for securing the motor drive device increases. Alternatively, when, for example, the motor drive device breaks down and is detached from the power magnetics cabinet, lots of time and effort are required.

SUMMARY OF THE INVENTION

An apparatus with a motor drive device according to the present invention is provided with a motor drive device and a support plate including an opening part for supporting the motor drive device. The support plate includes a first edge part around the opening part and a second edge part on the opposite side of the first edge part. The motor drive device includes a first recessed part formed on one end part in a predetermined direction, and a second recessed part formed on the other end part on the opposite side of the one end part. The first edge part is inserted into the first recessed part and the second edge part is inserted into the second recessed part so that the motor drive device is supported by the support plate.

In the above invention, the support plate can be formed so as to extend in any direction other than the horizontal direction. The first recessed part can be formed in the top face of the motor drive device. The second recessed part can be formed in the bottom face of the motor drive device, and can have a bottom part which is narrow enough to hold the tip end of the second edge part.

In the above invention, the support plate can be formed so as to extend in any direction other than the horizontal direction. The first recessed part can be formed in the top face of the motor drive device. The second recessed part can be formed in the bottom face of the motor drive device. The second edge part can have a shape bent toward a gravity center position of the motor drive device. The second recessed part can have a shape which corresponds to the shape of the second edge part so that the second edge part is brought into close contact with the second recessed part.

In the above invention, the support plate can be formed so as to extend in any direction other than the horizontal direction. The first recessed part can be formed in the top face of the motor drive device. The second recessed part can be formed in the bottom face of the motor drive device. The first edge part can have a shape bent in a direction opposite to the direction toward a gravity center position of the motor drive device. The first recessed part can extend in a direction opposite to the direction toward a gravity center position of the motor drive device so that the first edge part can be brought into close contact with the first recessed part. The second edge part can have a shape bent toward a gravity center position of the motor drive device. The second recessed part can have a shape which corresponds to the shape of the second edge part so that the second edge part can be brought into close contact with the second recessed part.

In the above invention, the first edge part can have a shape to be fit in the first recessed part, and the second edge part can have a shape to be fit in the second recessed part.

BRIEF DESCRIPTION OF THE DRAWINGS

FIG. 5 is an explanatory view of a third process of an operation for attaching a first motor drive device to a support plate.

FIG. 6 is a schematic partial sectional view illustrating the state before a second motor drive device in an embodiment is attached to a support plate.

DETAILED DESCRIPTION

With reference to FIGS. 1 to 18, an apparatus provided with a motor drive device in an embodiment will be described. In the present embodiment, a power magnetics cabinet will be described as an example of an apparatus provided with a motor drive device. The power magnetics cabinet has a function for supplying electricity to a predetermined device such as a robot or a machine tool. The power magnetics cabinet is provided with a motor drive device, a relay, a battery, a terminal, etc. In the present embodiment, an example in which a motor drive device is attached to a support plate disposed in the power magnetics cabinet will be described.

Figure 1:
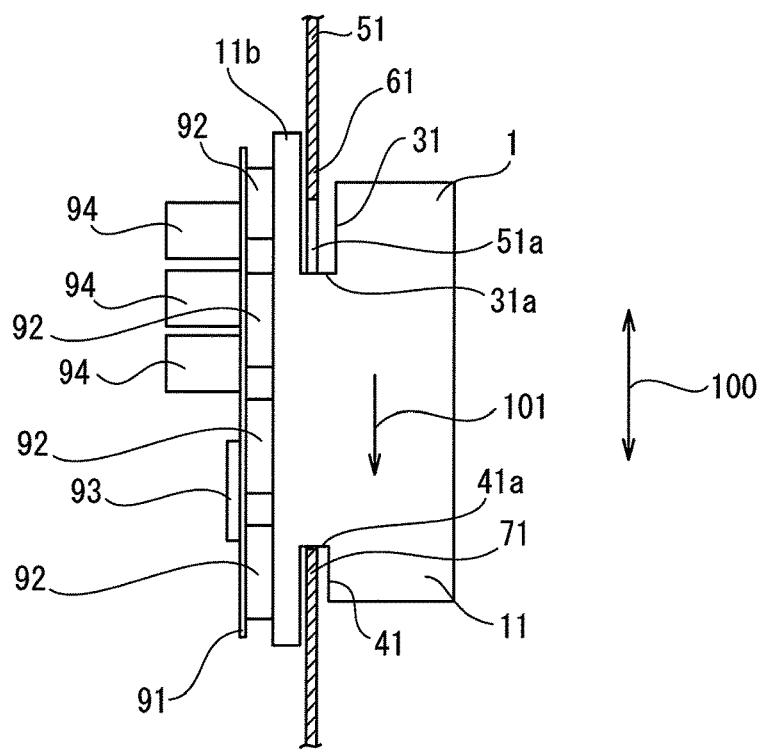
FIG. 1 is a schematic partial sectional view of a first motor drive device and a support plate in an embodiment.

FIG. 1 shows a schematic sectional view illustrating the state of a first motor drive device in the present embodiment being secured to a support plate. A first motor drive device 1 is supported by a support plate 51 of the power magnetics cabinet. The support plate 51 corresponds to a shelf plate which constitutes a shelf of the power magnetics cabinet, a wall plate which constitutes a wall surface of the power magnetics cabinet, or a frame of the power magnetics cabinet. The motor drive device 1 in the present embodiment is supported by the support plate 51 without using fastening members such as bolts or screws.

Figure 2:
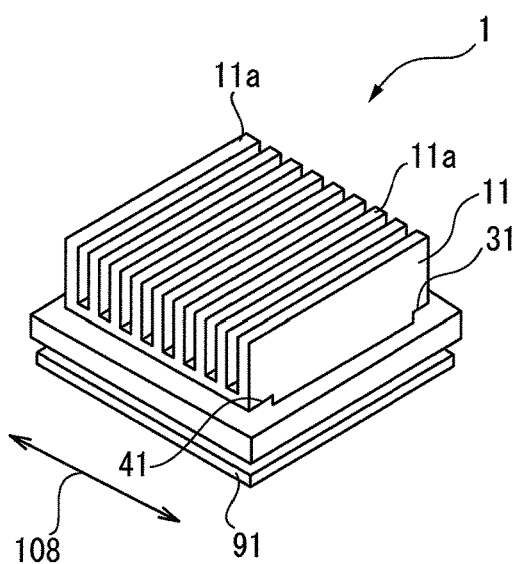
FIG. 2 is a schematic perspective view of a motor drive device in an embodiment.

FIG. 2 shows a perspective view of a first motor drive device in the present embodiment. With reference to FIGS. 1 and 2, the first motor drive device 1 is provided with power devices 92 for generating electricity to be supplied to a motor. The power devices 92 in the present embodiment are semiconductor elements, and are connected to a printed board 91. A control device 93 for controlling, for example, power devices 92, is disposed on the printed board 91. Further, electronic components, such as electrolytic capacitors 94 are disposed on the printed board 91. The first motor drive device 1 is provided with a heatsink 11 for releasing heat generated in the power devices 92. The heatsink 11 has a plurality of fins 11a. The power devices 92 are in contact with the heatsink 11. The heat generated in the power devices 92 is transferred to the heatsink 11. Then, the heat transferred to the heatsink 11 is released from the fins 11a to the atmosphere.

The first motor drive device 1 includes recessed parts formed in an outer surface. The recessed parts include a first recessed part 31 and a second recessed part 41 formed on the opposite side of the first recessed part 31. The recessed parts 31 and 41 of the first motor drive device 1 are formed in the heatsink 11. The recessed parts 31 and 41 in the present embodiment are formed so as to extend along the side faces of the heatsink 11. Further, the recessed parts 31 and 41 extend in the width direction of the motor drive device 1, which is designated by an arrow 108. The first recessed part 31 is formed at one end part of the motor drive device 1 in a predetermined direction. The second recessed part 41 is formed at the other end part opposite to the one end part.

The support plate 51 is disposed so as to extend in the vertical direction designated by an arrow 100. In the first motor drive device 1, the first recessed part 31 is formed in the top face of the heatsink 11. The second recessed part 41 is formed in the bottom face of the heatsink 11.

The support plate 51 has an opening part 51a for supporting the first motor drive device 1. The opening part 51a is a hole formed in the support plate 51. The motor drive device 1 is secured while being partly inserted in the opening part 51a. The first motor drive device 1 in the present embodiment has a quadrangular planar shape. Accordingly, the opening part 51a also has a quadrangular planar shape. The support plate 51 includes a first edge part 61 around the opening part 51a and a second edge part 71 on the opposite side of the first edge part 61.

The first edge part 61 of the support plate 51 is inserted into the first recessed part 31. Further, the second edge part 71 of the support plate 51 is inserted into the second recessed part 41. The first edge part 61 engages in the first recessed part 31, and the second edge part 71 engages in the second recessed part 41, so that the motor drive device 1 is supported by the support plate 51.

A gravitational force is exerted to the motor drive device 1 toward the second edge part 71 as designated by an arrow 101. Thus, the tip end of the second edge part 71 abuts with a bottom face 41a of the second recessed part 41. On this occasion, even when the motor drive device 1 moves, the contact of the first edge part 61 with a wall surface of the first recessed part 31 prevents the motor drive device 1 from being detached from the support plate 51. Namely, the motor drive device 1 is prevented from being detached from the support plate 51 by the contact of the first edge part 61 with the portion of the heatsink 11, in which a flange part 11b or the fins 11a are formed.

A method for attaching the first motor drive device 1 in the present embodiment to the support plate 51 will now be described.

Figure 3:
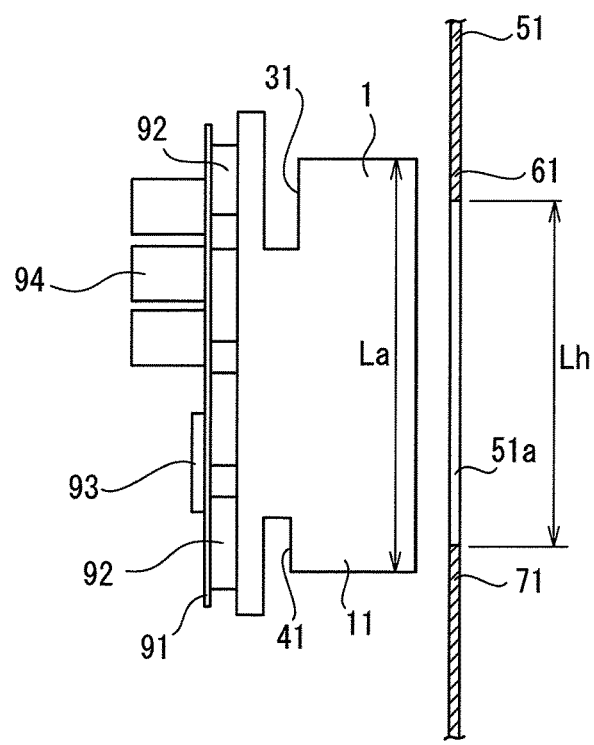
FIG. 3 is an explanatory view of a first process of an operation for attaching a first motor drive device to a support plate.

FIG. 3 is a schematic partial sectional view explaining a first process of an operation for attaching a first motor drive device to a support plate. The size of the planar shape of the opening part 51a of the support plate 51 is formed so as to be larger than the planar shape of the heatsink 11. The heatsink 11 is formed so as to have a length La larger than a length Lh of the opening part 51a in the direction in which the first recessed part 31 and the second recessed part 41 are opposed to each other. In FIG. 3, in the width direction, i.e., a direction perpendicular to the paper surface, the opening part 51a is formed so as to have a width larger than the width of the heatsink 11.

Figure 4:
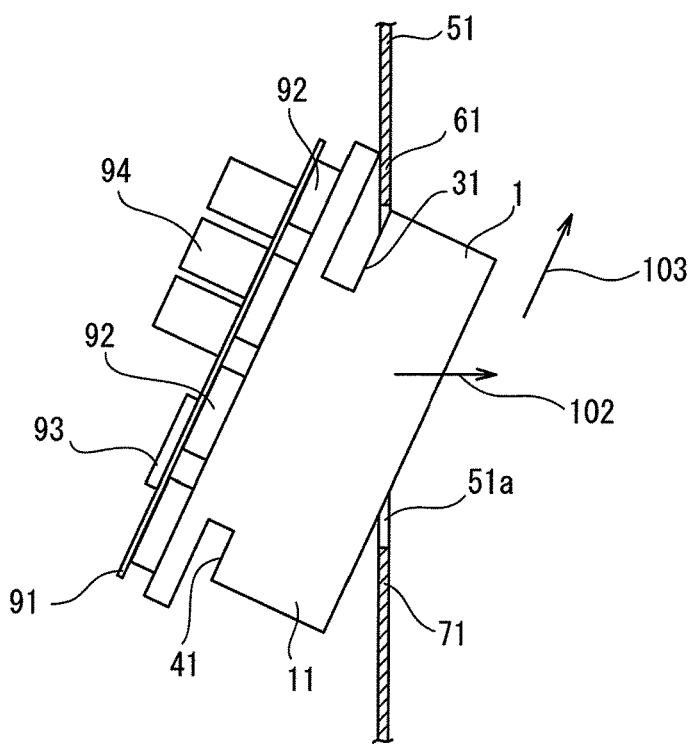
FIG. 4 is an explanatory view of a second process of an operation for attaching a first motor drive device to a support plate.

FIG. 4 shows a schematic partial sectional view explaining a second process of an operation for attaching a first motor drive device to a support plate. The motor drive device 1 is inclined with respect to the support plate 51. Then, as designated by an arrow 102, the heatsink 11 is partially inserted into the opening part 51a. On this occasion, the position and inclination of the first motor drive device 1 are adjusted so that the first edge part 61 can be inserted into the first recessed part 31. Subsequently, the motor drive device 1 is moved relative to the support plate 51, as designated by an arrow 103, to insert the first edge part 61 into the first recessed part 31.

FIG. 5 shows a schematic partial sectional view explaining a third process of an operation for attaching a first motor drive device to a support plate. The first edge part 61 of the support plate 51 is inserted into the first recessed part 31.

Subsequently, as designated by an arrow 104, the end part in which the second recessed part 41 is formed is moved toward the opening part 51*a*. The end part in which the second recessed part 41 is formed passes through the opening part 51*a*. Namely, the heatsink 11 passes through the opening part 51*a*. The motor drive device 1 is moved to a position at which the second edge part 71 can be inserted into the second recessed part 41.

After that, the motor drive device 1 is moved so that the second edge part 71 is inserted into the second recessed part 41. In this example, the motor drive device 1 is moved downward. The end face of the second edge part 71 is brought into contact with the bottom face 41*a* of the second recessed part 41. This operation enables the support plate 51 to be secured to the motor drive device 1 as shown in FIG. 1.

The motor drive device 1 can be detached from the support plate 51 in a reverse procedure to the attaching procedure. In an example shown in FIG. 1, the motor drive device 1 is lifted so that the end face of the first edge part 61 is brought into contact with a bottom face 31*a* of the first recessed part 31. Then, the end part of the heatsink 11 in which the second recessed part 41 is formed is pulled out from the opening part 51*a*. After the end part in which the second recessed part 41 is formed is drawn from the opening part 51*a*, the motor drive device 1 is moved downward. The first edge part 61 is drawn from the first recessed part 31, and then, the motor drive device 1 is removed from the support plate 51.

In the motor drive device in the present embodiment, the motor drive device can be attached to the support plate without using fastening members such as bolts or nuts. In the device in the present embodiment, the motor drive device can be attached to the support plate without using a tool. Thus, the motor drive device can be easily attached to the support plate. Alternatively, the motor drive device can be easily detached from the support plate. Furthermore, the number of components for attaching the motor drive device can be reduced. Note that fastening members, such as bolts may be, for example, used as auxiliary members.

The first recessed part and the second recessed part in the present embodiment are formed in the heatsink. However, the form is not limited to this. The first recessed part can be formed in the outer surface of one end part of the motor drive device in a predetermined direction. Further, the second recessed part can be formed in the outer surface of the other end part of the motor drive device. When the motor drive device is provided with, for example, a housing surrounding a printed board, a power device, etc., recessed parts may be formed in this housing.

Further, FIG. 1 shows, as an example, a support plate extending in the vertical direction. However, the form is not limited to this. The motor drive device can be secured to a support plate extending in any direction. The support plate may be located so as to extend in, for example, the horizontal direction. Alternatively, the support plate may be located so as to extend in a direction inclined with respect to the horizontal direction.

Subsequently, modifications of the apparatus provided with the motor drive device in the present embodiment will be described. In the modifications, the configuration of recessed parts and configuration of the edge part of a support plate around the opening part are different from those of the aforementioned first motor drive device.

Figure 7:
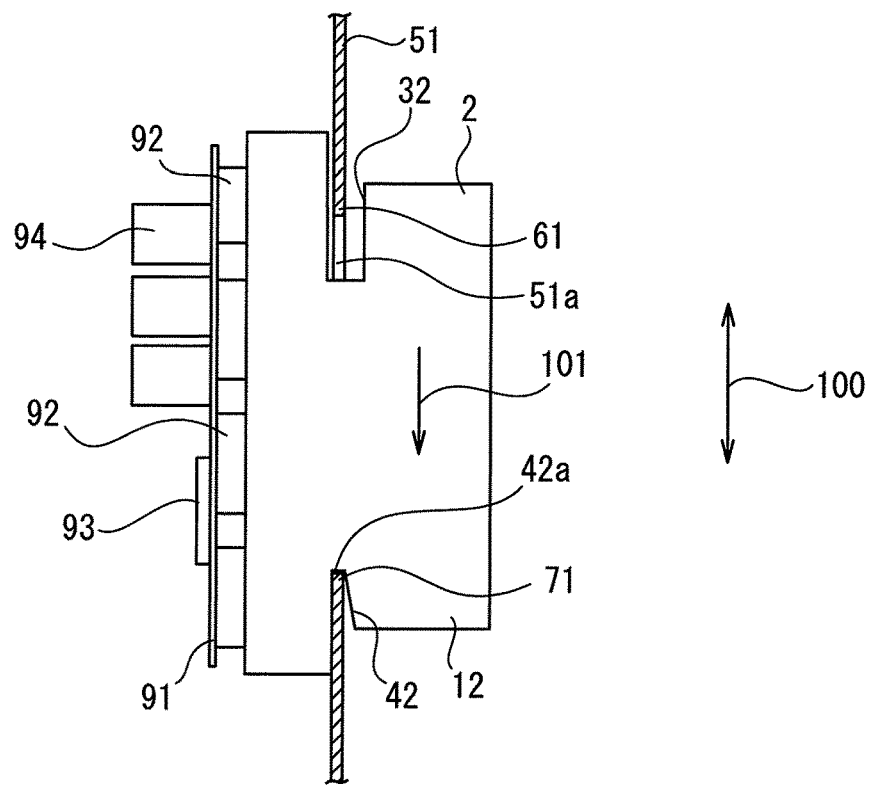
FIG. 7 is a schematic partial sectional view illustrating the state after a second motor drive device in an embodiment is attached to a support plate.

FIG. 6 shows a schematic partial sectional view of a second motor drive device and a support plate in the present embodiment. FIG. 7 shows a schematic partial sectional view illustrating the state of a second motor drive device in the present embodiment being secured to a support plate. With reference to FIGS. 6 and 7, a second motor drive device 2 includes a first recessed part 32 and a second recessed part 42 which are formed in a heatsink 12. The support plate 51 extends in the vertical direction designated by the arrow 100. The second motor drive device 2 is supported so that the direction in which the first recessed part 32 and the second recessed part 42 are opposed to each other is parallel to the vertical direction.

The first recessed part 32 is formed in the top face of a motor drive device 2. The second recessed part 42 is formed in the bottom face of the motor drive device 2. The configuration of the second recessed part 42 in the second motor drive device 2 is different from that in the first motor drive device 1. The second recessed part 42 has a shape with which the tip end of the second edge part 71 of the support plate 51 can be brought into close contact. The second recessed part 42 is tapered toward its bottom face 42*a*. Namely, the second recessed part 42 is formed so that its width gradually decreases toward its bottom. The bottom part of the second recessed part 42 is narrow enough to hold the tip end of the second edge part 71.

The second motor drive device 2 gravitates as designated by the arrow 101. The tip end of the second edge part 71 is retained by the bottom part of the second recessed part 42, and accordingly, the second edge part 71 can be strongly secured to the second recessed part 42. Thus, in the second motor drive device 2, the lower portion of the motor drive device 2 can be strongly secured.

Figure 8:
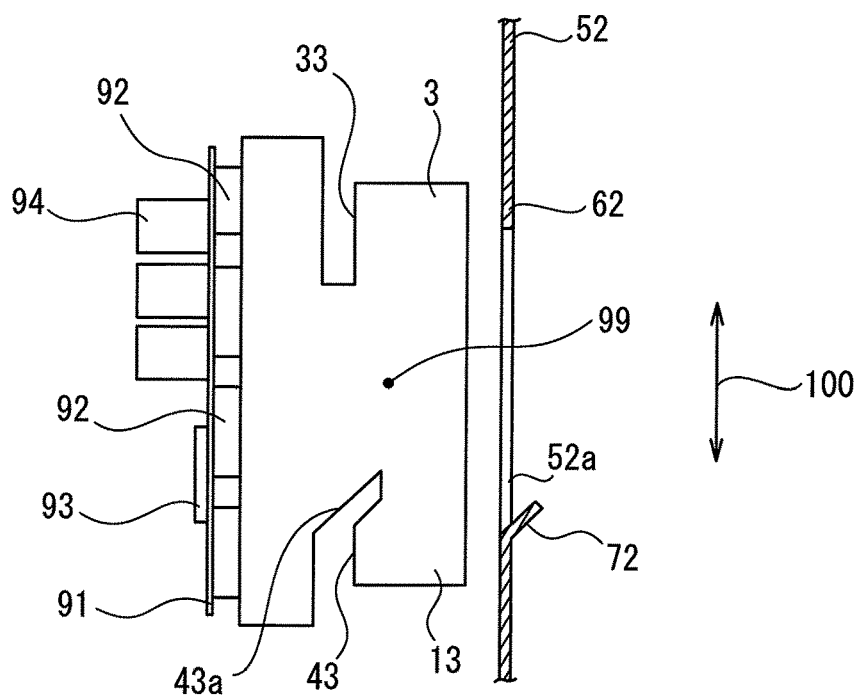
FIG. 8 is a schematic partial sectional view illustrating the state before a third motor drive device in an embodiment is attached to a support plate.
Figure 9:
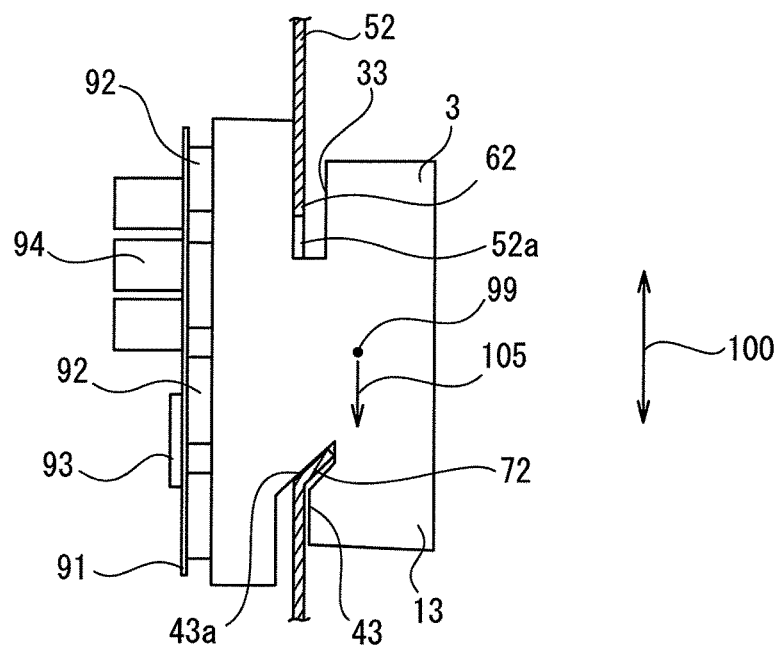
FIG. 9 is a schematic partial sectional view illustrating the state after a third motor drive device in an embodiment is attached to a support plate.

FIG. 8 shows a schematic sectional view of a third motor drive device and a support plate in the present embodiment. FIG. 9 shows a schematic partial sectional view illustrating the state of a third motor drive device in the present embodiment being secured to a support plate. With reference to FIGS. 8 and 9, a third motor drive device 3 includes a first recessed part 33 and a second recessed part 43 which are formed in a heatsink 13. Further, a support plate 52 includes a first edge part 62 and a second edge part 72. An opening part 52*a* for supporting the motor drive device 3 is formed in the support plate 52.

In the third motor drive device 3 and the support plate 52, the shape of the second recessed part 43 and the shape of the second edge part 72 are different from the shape of the first motor drive device 1 and the shape of the support plate 51. The third motor drive device 3 is supported so that the direction in which the first recessed part 33 and the second recessed part 43 are opposed is parallel to the vertical direction designated by the arrow 100.

The second edge part 72 has a sectional shape which is bent toward a gravity center position 99 of the motor drive device 3 when the motor drive device 3 is supported by the support plate 52. In the present embodiment, the second edge part 72 has a bent sectional shape. The second recessed part 43 extends toward the gravity center position 99 of the motor drive device 3, so as to correspond to the shape of the second edge part 72. The second recessed part 43 has a bent sectional shape. When the motor drive device 3 is supported by the support plate 52, the second edge part 72 is brought into close contact with the second recessed part 43.

In the third motor drive device 3, as designated by an arrow 105, a gravitational force is exerted to the gravity center position 99. The second edge part 72 has a shape bent toward the gravity center position 99, and accordingly, an inner surface 43*a* of the second recessed part 43 presses the second edge part 72. The second edge part 72 is brought into close contact with the inner surface 43*a* of the second recessed part 43. Thus, the lower portion of the motor drive device 3 can be strongly secured to the support plate 52.

Figure 10:
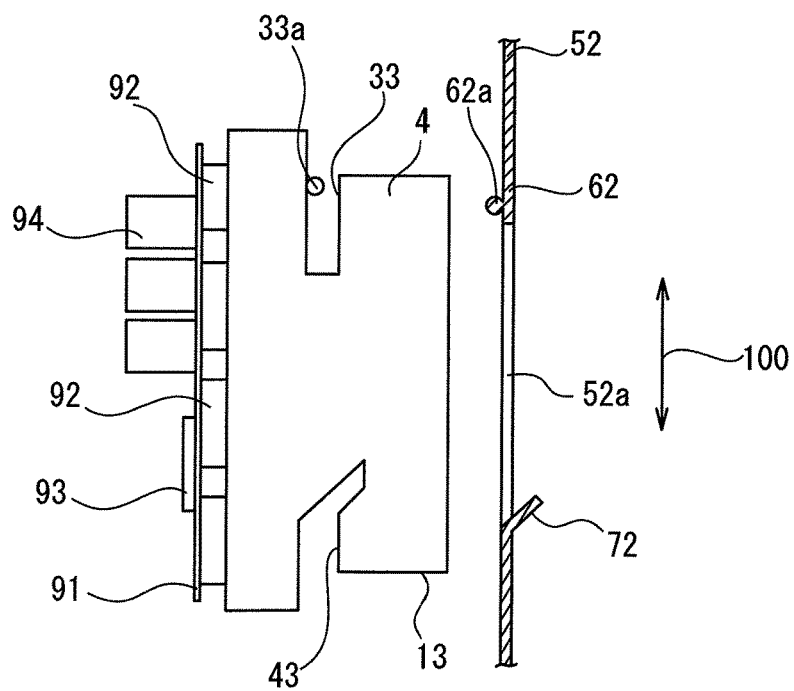
FIG. 10 is a schematic partial sectional view illustrating the state before a fourth motor drive device in an embodiment is attached to a support plate.
Figure 11:
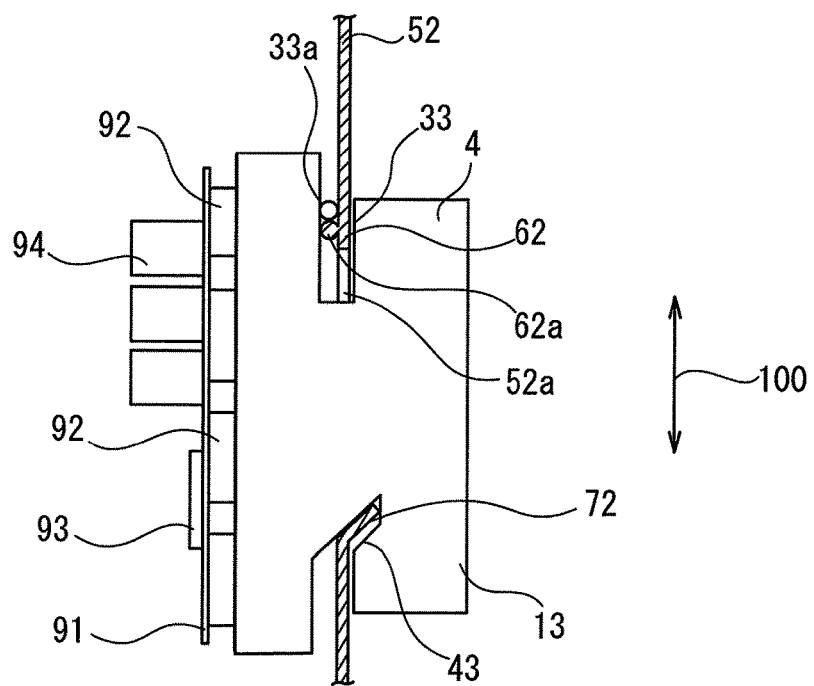
FIG. 11 is a schematic partial sectional view illustrating the state after a fourth motor drive device in an embodiment is attached to a support plate.

FIG. 10 shows a schematic partial sectional view of a fourth motor drive device and a support plate in the present embodiment. FIG. 11 shows a schematic partial sectional view illustrating the state of a fourth motor drive device in the present embodiment being secured to a support plate. With reference to FIGS. 10 and 11, in a fourth motor drive device 4 and the support plate 52, in addition to the configuration of the apparatus provided with the third motor drive device 3 and the support plate 52, a projection part 33a is formed on the inner surface of the first recessed part 33. Further, a projection part 62a is formed on the surface of the first edge part 62 of the support plate 52. The projection parts 62a and 33a in the present embodiment are linearly formed so as to extend in the width direction (the direction perpendicular to the paper surface) of the heatsink 13.

When the motor drive device 4 is supported by the support plate 52, the projection part 62a formed on the first edge part 62 is in contact with the projection part 33a formed on the surface of the first recessed part 33. The projection part 33a is located on the outside of the projection part 62a. As described above, the projection part 33a is formed inside the first recessed part 33 and the projection part 62a is formed on the first edge part 62. The projection part 33a engages with the projection part 62a. This structure enables the upper portion of the motor drive device 4 to be strongly secured to the support plate 52.

In the meantime, in the fourth motor drive device 4, similar to the first motor drive device 1, after the first edge part 62 is inserted into the first recessed part 33, the second edge part 72 can be inserted into the second recessed part 43. However, depending on the size of the projection parts 62a and 33a, the first edge part 62 may be difficult to be inserted into the first recessed part 33.

Figure 12:
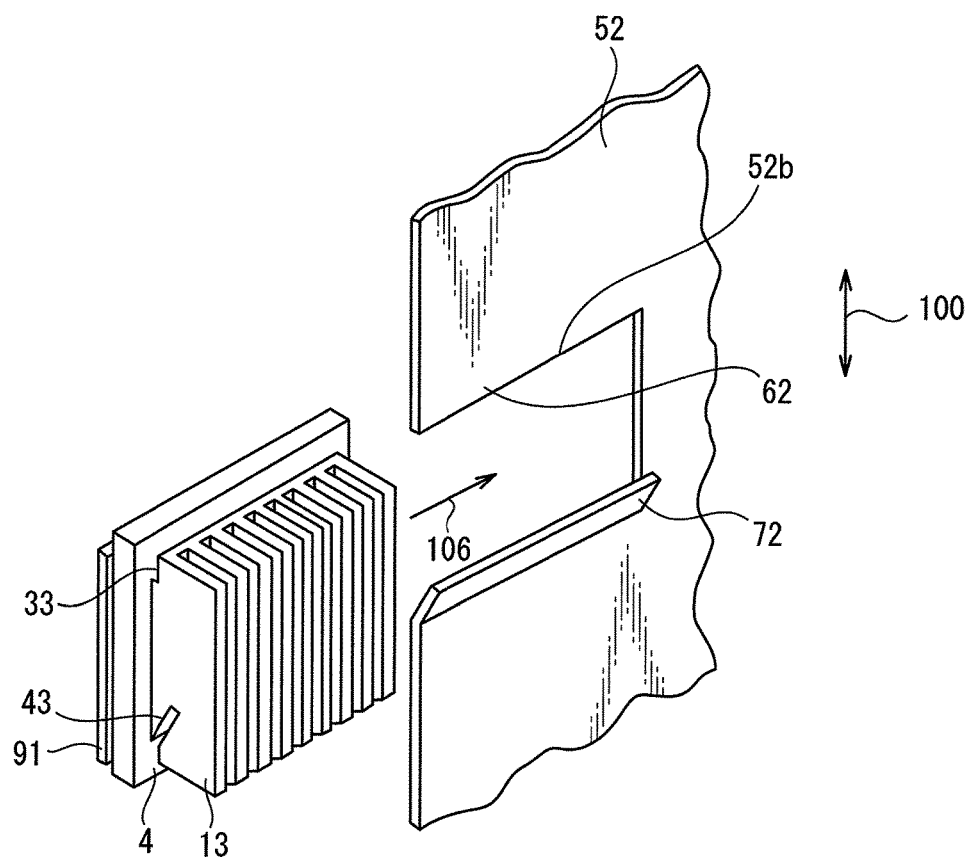
FIG. 12 is a schematic perspective view explaining an operation for attaching a fourth motor drive device to a support plate.

FIG. 12 shows a schematic view of another method for attaching the motor drive device in the present embodiment to a support plate. An opening part 52b having an open end is formed in the support plate 52. The opening part 52b is not a hole surrounded by an edge part, but has an open end to which the motor drive device 4 is to be inserted.

First, the motor drive device 4 is disposed along the shape of the opening part 52b. Subsequently, the second edge part 72 is inserted into the second recessed part 43. Further, the first edge part 62 is inserted into the first recessed part 33 so that the projection part 62a is located inside the projection part 33a. Then, as designated by an arrow 106, the parallel movement of the motor drive device 4 relative to the support plate 52 enables the motor drive device 4 to be attached to the support plate 52. Thus, the formation of an opening part having an open end in a support plate allows easy assembling even though a first edge part and a second edge part have complicated shapes.

Figure 13:
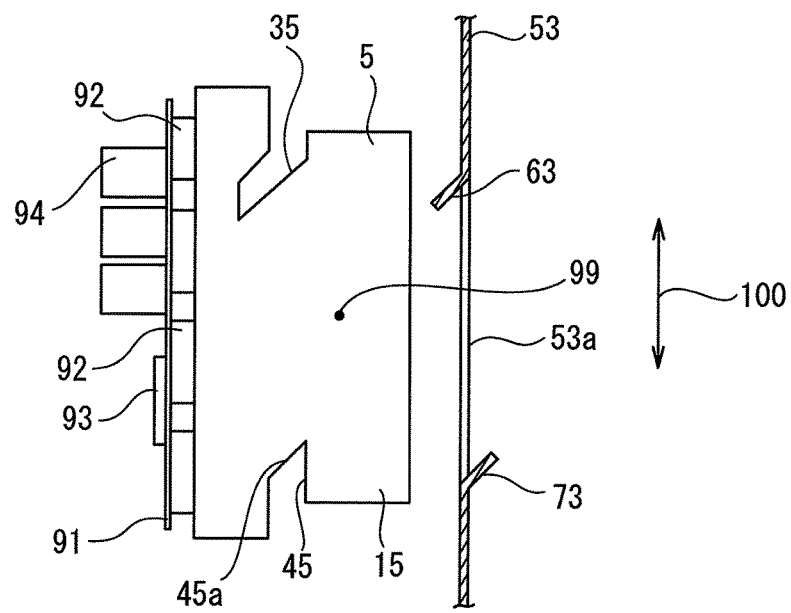
FIG. 13 is a schematic partial sectional view illustrating the state before a fifth motor drive device in an embodiment is attached to a support plate.
Figure 14:
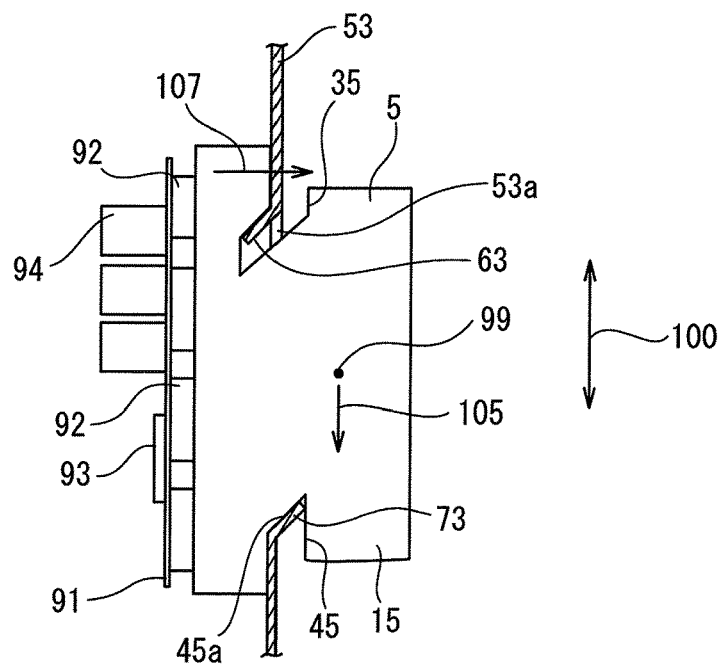
FIG. 14 is a schematic partial sectional view illustrating the state after a fifth motor drive device in an embodiment is attached to a support plate.

FIG. 13 shows a schematic partial sectional view of a fifth motor drive device and a support plate in the present embodiment. FIG. 14 is a schematic partial sectional view illustrating the state of a fifth motor drive device being secured to a support plate. A fifth motor drive device 5 includes a first recessed part 35 and a second recessed part 45 which are formed in a heatsink 15. The support plate 53 has a first edge part 63 and a second edge part 73. An opening part 53a is formed in the support plate 53.

The second edge part 73 has a shape bent toward the gravity center position 99 of the motor drive device 5 when the motor drive device 5 is secured to the support plate 53. The second recessed part 45 has a shape which corresponds to the shape of the second edge part 73 and with which the second edge part 73 is brought into close contact. An inner face 45a of the second recessed part 45 extends toward the gravity center position 99 of the motor drive device 5. The first edge part 63 of the support plate 53 has a shape bent in a direction opposite to the direction toward the gravity center position 99 of the motor drive device 5 when the motor drive device 5 is secured to the support plate 53. The first recessed part 35 has a shape with which the first edge part 63 is to be in close contact. The first recessed part 35 corresponds to the shape of the first edge part 63, and extends in a direction opposite to the direction toward the gravity center position 99.

In the fifth motor drive device 5, as designated by the arrow 105, a gravitational force is exerted to the gravity center position 99. On this occasion, similar to the third motor drive device 3, the second edge part 73 is brought into close contact with the inner face 45a of the second recessed part 45 located on the downside so as to strongly secure the lower portion of the motor drive device 5.

In the upper portion of the motor drive device 5, the application of a gravitational force designated by the arrow 105 generates a force to be exerted in the direction designated by an arrow 107 when the second edge part 73 functions as a fulcrum point. The first edge part 63 has a shape bent in a direction opposite to the direction toward the gravity center position 99, and thus, the inner surface of the first recessed part 35 is pressed against the first edge part 63. Thus, the first edge part 63 is brought into close contact with the first recessed part 35. As described above, the fifth motor drive device 5 can be strongly secured to the support plate 53 even in the upper portion thereof.

The first motor drive device to the fifth motor drive device in the present embodiment are preferable for an apparatus in which a support plate supporting a motor drive device extends in the vertical direction, because a gravitational force is used. Alternatively, the first to the fifth motor drive devices are preferable for an apparatus in which a support plate extends in any direction other than the horizontal direction. These are preferable for, for example, an apparatus in which a support plate is inclined with respect to the horizontal direction.

Figure 15:
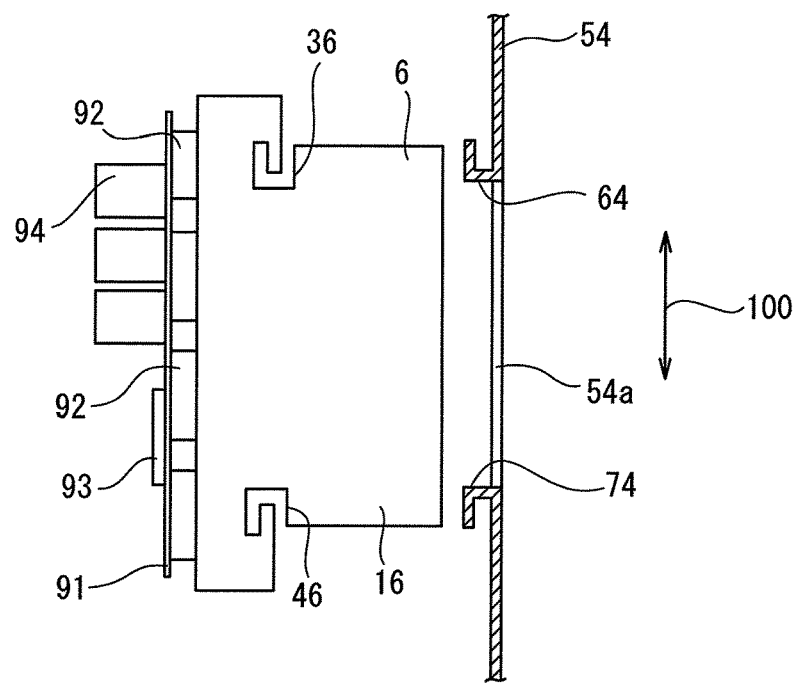
FIG. 15 is a schematic partial sectional view illustrating the state before a sixth motor drive device in an embodiment is attached to a support plate.
Figure 16:
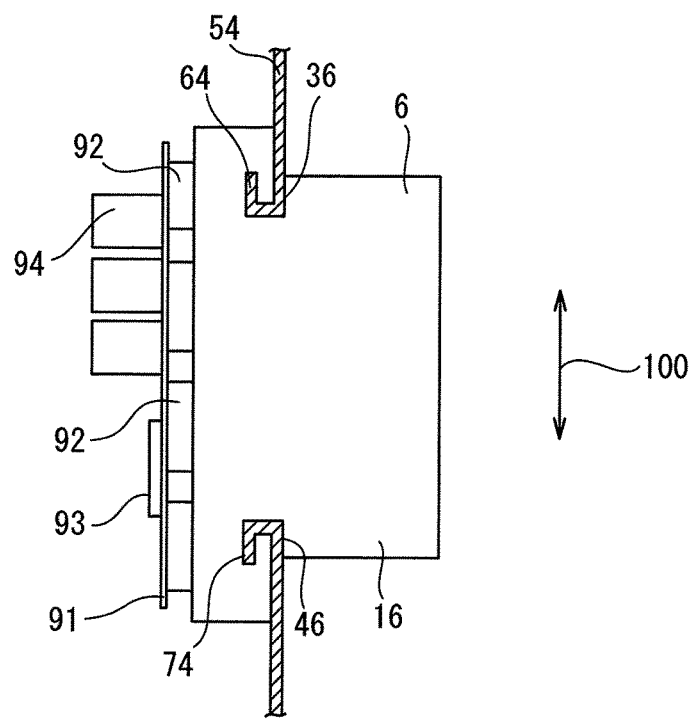
FIG. 16 is a schematic partial sectional view illustrating the state after a sixth motor drive device in an embodiment is attached to a support plate.

FIG. 15 shows a schematic partial sectional view of a sixth motor drive device and a support plate in the present embodiment. FIG. 16 shows a schematic partial sectional view illustrating the state of a sixth motor drive device in the present embodiment being secured to a support plate. The sixth motor drive device 6 has a first recessed part 36 and a second recessed part 46 which are formed in a heatsink 16. The support plate 54 has a first edge part 64 and a second edge part 74. An opening part 54a is formed in the support plate 54.

In the sixth motor drive device 6, the first edge part 64 has a shape to be fit in the first recessed part 36. The first edge part 64 has a shape to be in contact with the first recessed part 36 without clearance therebetween. Further, the second edge part 74 has a shape to be fit in the second recessed part 46. The second edge part 74 has a shape to be in contact with the second recessed part 46 without clearance therebetween. In the sixth motor drive device 6, the first edge part 64 and the second edge part 74 have a U-shaped sectional shape. Further, the first recessed part 36 and the second recessed part 46 are formed so as to have a U-shaped sectional shape corresponding to the shape of the first edge part 64 and the second edge part 74.

The opening part 54a of the support plate 54 has an open end. When the sixth motor drive device 6 is secured to the support plate 54, a method similar to another method for attaching the fourth motor drive device to the support plate can be adopted. Namely, the parallel movement of the motor drive device 6 through the open side of the opening part 54*a* enables the motor drive device 6 to be attached to the support plate.

In the sixth motor drive device 6, each of edge parts is fit in the corresponding one of recessed parts, and accordingly, one edge part and the other edge part of the motor drive device 6 can be strongly secured to the support plate 54. In an example shown in FIG. 16, the upper portion and the lower portion of the motor drive device 6 can be strongly secured to the support plate 54. The shape of the portion in which each edge part is fit in the recessed part is not limited to a U shape in section, and includes any shape.

Figure 17:
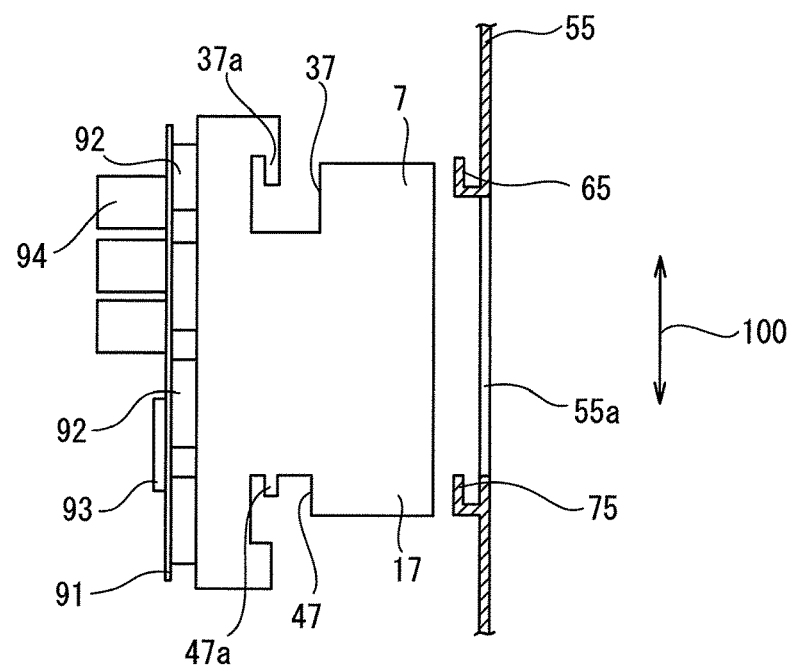
FIG. 17 is a schematic partial sectional view illustrating the state before a seventh motor drive device in an embodiment is attached to a support plate.
Figure 18:
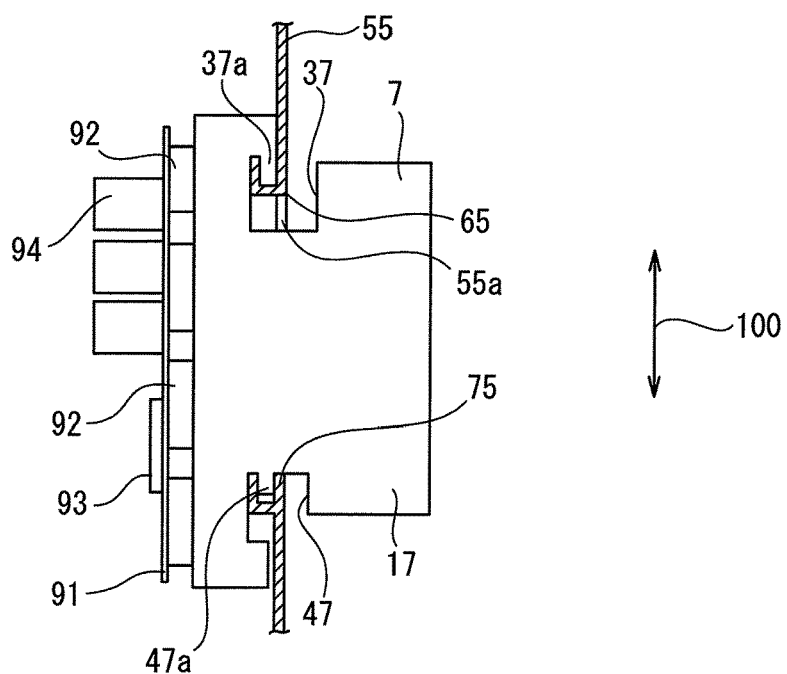
FIG. 18 is a schematic partial sectional view illustrating the state after a seventh motor drive device in an embodiment is attached to a support plate.

FIG. 17 shows a schematic partial sectional view of a seventh motor drive device and a support plate in the present embodiment. FIG. 18 shows a schematic partial sectional view illustrating the state of a seventh motor drive device in the present embodiment being secured to a support plate. A seventh motor drive device 7 has a first recessed part 37 and a second recessed part 47, which are formed in a heat sink 17. A support plate 55 has a first edge part 65 and a second edge part 75. An opening part 55*a* is formed in the support plate 55.

A convex part 37*a* is formed inside the first recessed part 37. The convex part 37*a* is linearly formed so as to extend in the width direction of the motor drive device 7. The convex part 37*a* is engaged with the first edge part 65. Further, a convex part 47*a* is formed inside the second recessed part 47. The convex part 47*a* is linearly formed so as to extend in the width direction of the motor drive device 7. The convex part 47*a* is engaged with the second edge part 75.

In the seventh motor drive device 7, the first edge part 65 has a shape to be fit in the first recessed part 37. Further, the second edge part 75 has a shape to be fit in the second recessed part 47. Thus, the seventh motor drive device 7 can be strongly secured to the support plate 55.

In the sixth motor drive device and the support plate, or the seventh motor drive device and the support plate, the motor drive device can be strongly secured to the support plate without receiving the action of gravity. Namely, the motor drive device can be stably supported by the support plate. Thus, the sixth motor drive device and the seventh motor drive device are preferable for the apparatus in which the support plate extends in the horizontal direction or in a direction close to the horizontal direction.

In the above embodiments, a power magnetics cabinet is adopted as an example of the apparatus provided with a motor drive device. However, the form is not limited to this, and any apparatus provided with a motor drive device can be adopted. Examples of the apparatus having a motor drive device include a power magnetics cabinet of a machine tool, a power magnetics cabinet of a robot, and other power source devices for the devices having motors.

The present invention can provide an apparatus provided with an easily-attachable motor drive device.

The above embodiments can be appropriately combined. In the above drawings, the same or corresponding portions are designated with the same reference numerals. Note that the above embodiments are examples, and do not limit the invention. Further, the embodiments include modifications of aspects described in the claims.

The invention claimed is:
1. An apparatus with a motor drive device, comprising:
   a motor drive device; and
   a support plate including at least one opening part for supporting the motor drive device, wherein the support plate includes a first edge part around the opening part and a second edge part around the opening, the second edge part located on an opposite side of the opening from the first edge part,
   the motor drive device includes a first recessed part formed on one end part in a predetermined direction, and a second recessed part formed on an other end part of the motor drive device located on a side of the motor drive device opposite from the one end part,
   the first edge part is arranged in the first recessed part and the second edge part is arranged in the second recessed part, and the first edge part contacts a surface of the first recessed part and the second edge part contacts a surface of the second recessed part so that the motor drive device is engaged with the one opening part and secured to the support plate solely by the first and second edge parts without requiring additional securing devices.

2. The apparatus with a motor drive device according to claim 1, wherein
   the support plate is formed so as to extend in any direction other than the horizontal direction,
   the first recessed part is formed in the top face of the motor drive device, and the second recessed part is formed in the bottom face of the motor drive device, and has a bottom part which is narrow enough to hold a tip end of the second edge part.

3. The apparatus with a motor drive device according to claim 1, wherein the support plate is formed so as to extend in any direction other than the horizontal direction,
   the first recessed part is formed in the top face of the motor drive device,
   the second recessed part is formed in the bottom face of the motor drive device,
   the second edge part has a shape bent toward a gravity center position of the motor drive device, and the second recessed part has a shape which corresponds to a shape of the second edge part so that the second edge part is brought into close contact with the second recessed part.

4. The apparatus with a motor drive device according to claim 1, wherein
   the support plate is formed so as to extend in any direction other than the horizontal direction,
   the first recessed part is formed in the top face of the motor drive device,
   the second recessed part is formed in the bottom face of the motor drive device,
   the first edge part has a shape bent in a direction opposite to the direction toward a gravity center position of the motor drive device,
   the first recessed part extends in a direction opposite to the direction toward the gravity center position of the motor drive device so that the first edge part is brought into close contact with the first recessed part,
   the second edge part has a shape bent toward the gravity center position of the motor drive device,
   the second recessed part has a shape which corresponds to the shape of the second edge part so that the second edge part is brought into close contact with the second recessed part.

5. The apparatus with a motor drive device according to claim 1, wherein
   the first edge part has a shape to be fit in the first recessed part, and the second edge part has a shape to be fit in the second recessed part.

\* \* \* \* \*